(12) United States Patent
Do et al.

(10) Patent No.: US 6,630,856 B2
(45) Date of Patent: *Oct. 7, 2003

(54) HIGH-SPEED BANK SELECT MULTIPLEXER LATCH

(75) Inventors: Tuan P. Do, San Jose, CA (US); Brian J. Campbell, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/313,209

(22) Filed: Dec. 6, 2002

(65) Prior Publication Data

US 2003/0062944 A1  Apr. 3, 2003

Related U.S. Application Data

(63) Continuation of application No. 09/678,482, filed on Oct. 2, 2000, now Pat. No. 6,522,189.

(51) Int. Cl.[7] .................... H03K 17/62; H03K 17/693
(52) U.S. Cl. ........................ 327/407; 327/408
(58) Field of Search ................. 327/407, 408, 327/409, 410, 299, 52, 57; 326/115, 119, 120, 121, 122

(56) References Cited

U.S. PATENT DOCUMENTS

| | | | |
|---|---|---|---|
| 4,390,988 A | 6/1983 | Best et al. ................. 326/120 |
| 5,455,528 A | 10/1995 | Partovi et al. ............... 326/98 |
| 5,455,802 A | 10/1995 | McClure ..................... 327/57 |
| 5,568,076 A | 10/1996 | Pelella et al. ............... 327/174 |
| 5,896,046 A | 4/1999 | Bjorksten et al. ............ 326/98 |
| 6,084,437 A | 7/2000 | Sako ......................... 326/113 |
| 6,090,153 A | 7/2000 | Chen et al. ................... 716/8 |
| 6,122,217 A | 9/2000 | Keeth et al. ............ 365/230.03 |
| 6,204,538 B1 | 3/2001 | Kim ............................. 708/300 |
| 6,522,189 B1 * | 2/2003 | Do et al. ..................... 327/407 |

FOREIGN PATENT DOCUMENTS

| EP | 703 668 | 3/1996 |
|---|---|---|

OTHER PUBLICATIONS

European Search Report for EP 26 225–50 (01308391.0–2210–), mailed Apr. 2, 2003, 3 pp.

* cited by examiner

Primary Examiner—Tuan T. Lam
(74) Attorney, Agent, or Firm—Lawrence J. Merkel; Meyertons, Hood, Kivlin, Kowert & Goetzel, P.C.

(57) ABSTRACT

A high-speed bank select multiplexer latch may be coupled to a pair of differential output nodes and configured to capture and retain an output on the pair of differential output nodes responsive to two or more pairs of differential data inputs being active. A first subcircuit including a first N-channel transistor and a second N-channel transistor is configured to receive at least a first input signal and a second input signal and to drive a first output on a first output node responsive to either of the first input signal or the second input signal being active. Additionally, a second subcircuit including a third N-channel transistor and a fourth N-channel transistor is configured to receive at least a third input signal and a fourth input signal and to drive a second output on a second output node responsive to either of the third input signal or the fourth input signal being active. A latching circuit including a first inverter and a second inverter is coupled to the first output node and the second output node and configured to retain the first output on the first output node and the second output on the second output node. A charging circuit is contemplated and includes at least a first NOR gate, a second NOR gate, and first and second P-channel transistors. The charging circuit is configured to drive the output on the pair of differential output nodes in response to the pairs of differential input signals as well.

23 Claims, 3 Drawing Sheets

HIGH-SPEED BANK SELECT MULTIPLEXER LATCH

This application is a continuation application of U.S. patent application Ser. No. 09/678,482, filed Oct. 2, 2000, now U.S. Pat. No. 6,522,189.

BACKGROUND OF THE INVENTION

1. Field of the Invention

This invention relates to cache memory subsystems, and more particularly, to sense amplifier multiplexer latch designs.

2. Description of the Related Art

In some cache memory designs, the cache may include two or more banks of memory. Each bank may be a memory array of rows and columns of memory cells. The rows may be accessed by a word select control circuit and the columns in a row may provide output values via a pair of bit lines per column. Upon a memory read, one bank may be selected and the bit lines corresponding to a particular memory cell in that bank may transmit the value in the cell to a sense amplifier. The bit lines are typically differential outputs to the sense amplifier. The two differential outputs are sometimes referred to as a "bit" signal and a "bit bar" signal. The bit lines may carry voltages corresponding to a binary value stored in one of the bit cells within the cache array. Particularly, the memory cell may develop a relatively small differential on the bit lines to indicate the binary value stored (e.g. on the order of 100 millivolts). The sense amplifiers may sense the differential voltage on the bit lines and amplify the sensed differential voltage on a pair of output lines of the sense amp such that one output line may carry a high voltage (e.g. VDD) and the other output line may carry a low voltage (e.g. ground). The sense amplifiers' differential output may be precharged to a known value prior to any output lines becoming active. The precharging may occur during one phase of a clock while the output lines may be active during another phase of the clock. In this case, it may be necessary to capture or latch the sense amplifier outputs prior to the output lines being precharged during a subsequent clock phase.

Each of the above-mentioned banks of memory may include sense amplifiers for providing outputs from that bank. Since only one bank is typically read during a memory read, the outputs from the banks of the cache are typically multiplexed to provide read data from a single bank as the output from the cache to circuitry receiving the read data. Thus, the multiplexer must typically receive the bank select control signal to select the output data.

SUMMARY OF THE INVENTION

A bank select multiplexer latch circuit may be coupled to a pair of differential output nodes and configured to capture and retain an output on the pair of differential output nodes responsive to two or more pairs of differential data inputs being active. In one embodiment, a first subcircuit including a first N-channel transistor and a second N-channel transistor is configured to receive at least a first input signal and a second input signal and to drive a first output on a first output node responsive to either of the first input signal or the second input signal being active. Additionally, a second subcircuit including a third N-channel transistor and a fourth N-channel transistor is configured to receive at least a third input signal and a fourth input signal and to drive a second output on a second output node responsive to either of the third input signal or the fourth input signal being active. A latching circuit including a first inverter and a second inverter is coupled to the first output node and the second output node and configured to retain the first output on the first output node and the second output on the second output node.

Broadly speaking, in one embodiment, a circuit is contemplated comprising a first subcircuit including a first N-channel transistor and a second N-channel transistor. The first subcircuit is coupled to receive at least a first input signal and a second input signal. The first subcircuit is also configured to drive a first output on a first output node responsive to either of the first input signal or the second input signal being active. The circuit also comprises a second subcircuit including a third N-channel transistor and a fourth N-channel transistor. The second subcircuit is coupled to receive at least a third input signal and a fourth input signal. The second subcircuit is also configured to drive a second output on a second output node responsive to either of the third input signal or the fourth input signal being active. Additionally, the circuit further comprises a latching circuit including a first inverter and a second inverter. The latching circuit is coupled to the first output node and the second output node. The latching circuit is configured to capture and retain the first output on the first output node and the second output on the second output node.

In other embodiments the circuit may include a third subcircuit coupled receive the first, second, third and fourth input signals and coupled to the first and second output nodes. The third subcircuit is also configured to drive a third output on the second output node responsive to either one of the first input signal or the second input signal being active. The third subcircuit is configured to drive a fourth output on the first output node responsive to either one of the third input signal or the fourth input signal being active.

In an alternative embodiment, a circuit is contemplated comprising a first circuit coupled to receive a first pair of differential data inputs and a second pair of differential data inputs. The first circuit is coupled to a pair of differential output nodes and is configured to capture and retain an output on the pair of differential output nodes responsive to a corresponding one of the first pair of differential data inputs or the second pair of differential data inputs being active. A second circuit is also contemplated including a first NOR gate, a first P-Channel transistor, a second NOR gate and second P-channel transistor. The second circuit is connected in parallel to the first circuit and is configured to drive an output on the pair of differential output nodes responsive to a corresponding one of the first pair of differential data inputs or the second pair of differential data inputs being active. In addition, the first NOR gate is coupled to receive a first input signal from the first pair of differential data inputs and a second input from the second pair of differential data inputs. The second NOR gate is coupled to receive a third input signal from the first pair of differential data inputs and a fourth input signal from the second pair of differential data inputs.

In addition, a method of operating a circuit is contemplated. In one embodiment, the circuit receives a first input signal, a second input signal, a third input signal and a fourth input signal. The circuit drives a differential output on a first output node and a second output node responsive to the first input signal, the second input signal, the third input signal and the fourth input signal being active. Furthermore, the circuit retains the differential output on the first output node and the second output node responsive to the first input signal, the second input signal, the third input signal and the fourth input signal becoming inactive.

BRIEF DESCRIPTION OF THE DRAWINGS

Other objects and advantages of the invention will become apparent upon reading the following detailed description and upon reference to the accompanying drawings in which.

Figure 1:
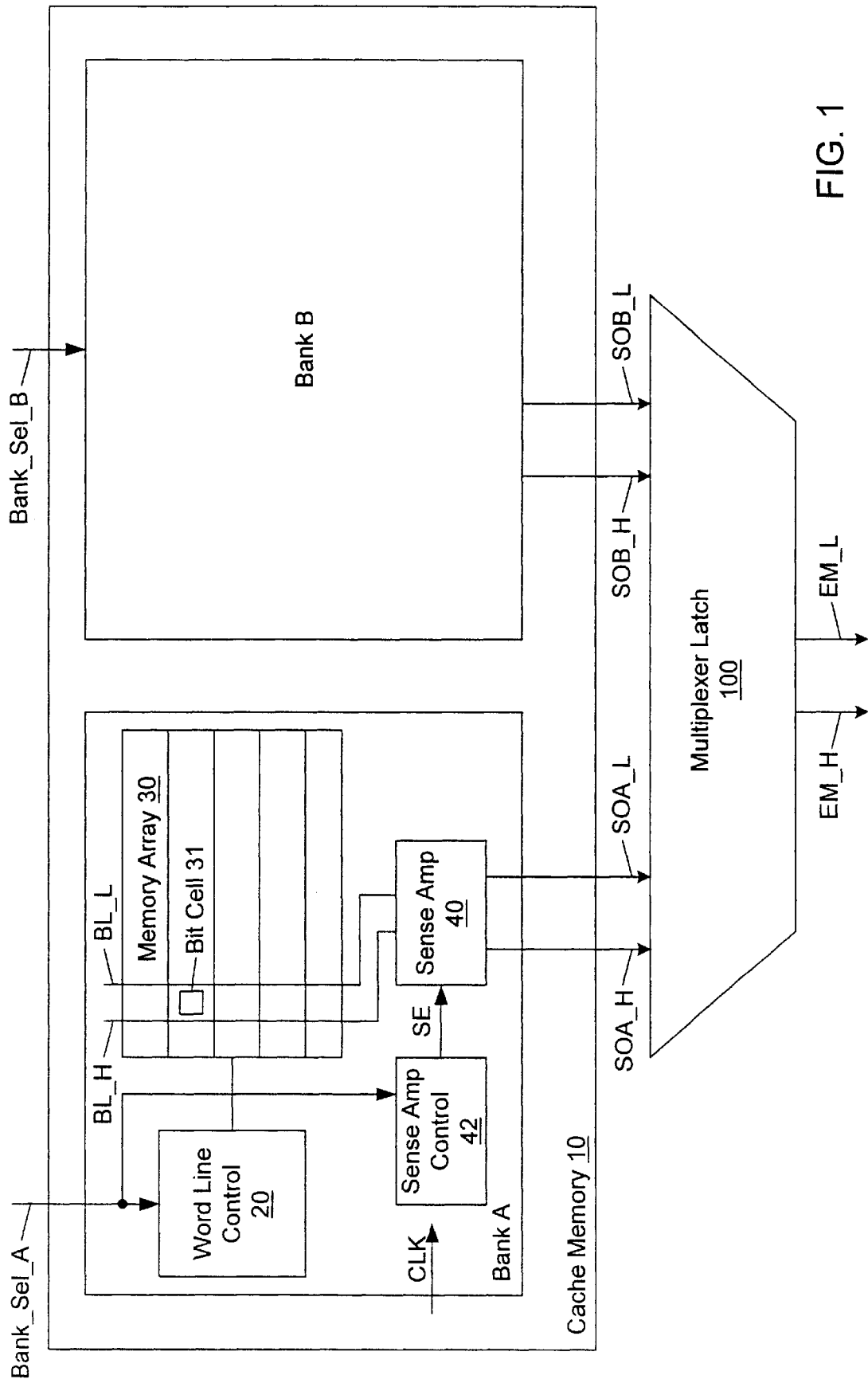
FIG. 1 is a block diagram of one embodiment of a cache memory subsystem.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to FIG. 1, a block diagram of one embodiment of a cache memory subsystem is shown. A cache memory 10 includes two memory banks labeled Bank A and Bank B. In this example, Bank B may operate in the same manner as Bank A and therefore only Bank A is illustrated in detail. Bank A includes a memory array 30 that includes a plurality of bit cells, one of which is shown as a bit cell 31. Memory array 30 is divided into rows and columns. Each column may include a bit cell 31 from each row. The rows are accessed by a word line control circuit 20. When a particular row is accessed, word line control circuit 20 activates a word line coupled to each bit cell 31 in that row. In response to the activated word line, bit cell 31 begins to discharge one of a line of a pair of bit lines BL_H or BL_L to indicate the value stored in that bit cell. The BL_H and BL_L signals may be similar to the above-mentioned "bit" and "bit bar" signals, respectively. A sense amplifier ("sense amp") 40 senses the bit lines BL_H and BL_L under the control of sense amp control circuit 42 coupled thereto. Bit cell 31 may develop a relatively small difference voltage on bit lines BL_H and BL_L, and sense amp 40 may amplify the difference to a full differential signal on output lines SOA_H and SOA_L. The full differential signal may be indicated by one output line SOA_H or SOA_L being at a high voltage (e.g. VDD) and the other output line being at a low voltage (e.g. ground).

Either Bank A or Bank B may be active at any given time depending on which bank select is active. The banks are selected by activating either the Bank_Sel_A signal or the Bank_Sel_B signal. Sense amp control circuit 42 may receive the Bank_Sel_A signal and may provide a sense amp enable (SE in FIG. 1) to sense amp 40. If the Bank_Sel_A signal is inactive (indicating that bank A is not selected), sense amp control circuit 42 may not activate the sense amp enable to sense amp 40, and thus sense amp 40 may not provide any output on SOA_H and SOA_L (i.e. the SOA_H and SOA_L lines may remain in their precharged state). If the Bank_Sel_A signal is active (indicating that bank A is selected), sense amp control circuit 42 may activate the sense amp enable to sense amp 40, causing sense amp 40 to amplify the differential sensed on bit lines BL_H and BL_L to the output lines SOA_H and SOA_L. For example, the sense amp control circuit 42 may activate the sense amp enable responsive to the Bank_Sel_A line being active and a clock signal CLK (e.g. the sense amp enable may be activated according to a delayed edge of the clock signal). In the illustrated embodiment, the word line control circuit 20 also receives the bank select signal and may not activate a word line to cause the bit lines to remain precharged, which may result in power savings.

The Bank B amplified differential bit line signals are designated SOB_H and SOB_L. Multiplexer latch 100 selects one of the differential pairs SOA_H and SOA_L or SOB_H and SOB_L for output as the differential pair EM_H and EM_L responsive to one of the signals in the selected differential pair being active.

It is noted that, although two banks are illustrated in FIG. 1, it is contemplated any number of banks may be multiplexed by a multiplexer latch circuit 100 to differential output EM_H and EM_L. In addition to multiplexing two or more banks, multiplexer latch circuit 100 may also latch the selected differential so that the input differential signals (SOA_H, SOA_L, SOB_H, and SOB_L) may be precharged during for the next access while still allowing the selected output to be read on the EM_H and EM_L signals.

It is noted that, while FIG. 1 illustrates the multiplexing of one bit from the banks to an output, multiple multiplexer latch circuits 100 may be employed in parallel to read multiple bits from the selected bank.

As mentioned above, BL_H and BL_L are a differential pair of signals, as are SOA_H and SOA_L, SOB_H and SOB_L, and EM_H and EM_L. For the illustrated embodiment, BL_H and BL_L may be precharged high. A binary one may be represented by BL_H being a higher voltage than BL_L, and a binary zero may be represented by BL_L being a higher voltage than BL_H. The other pairs of differential signals (SOA_H and SOA_L, SOB_H and SOB_L) may be precharged low. The pairs of differential signals may represent a binary one by the "_H" signal being active (SOA_H, SOB_H, and EM_H) and the "_L" signal being inactive. A binary zero may be represented by the "_L" signal being active and the "_H" signal being inactive. In other embodiments, these signals may be precharged high and may reverse the representations of binary zero and one, as desired.

Figure 2:
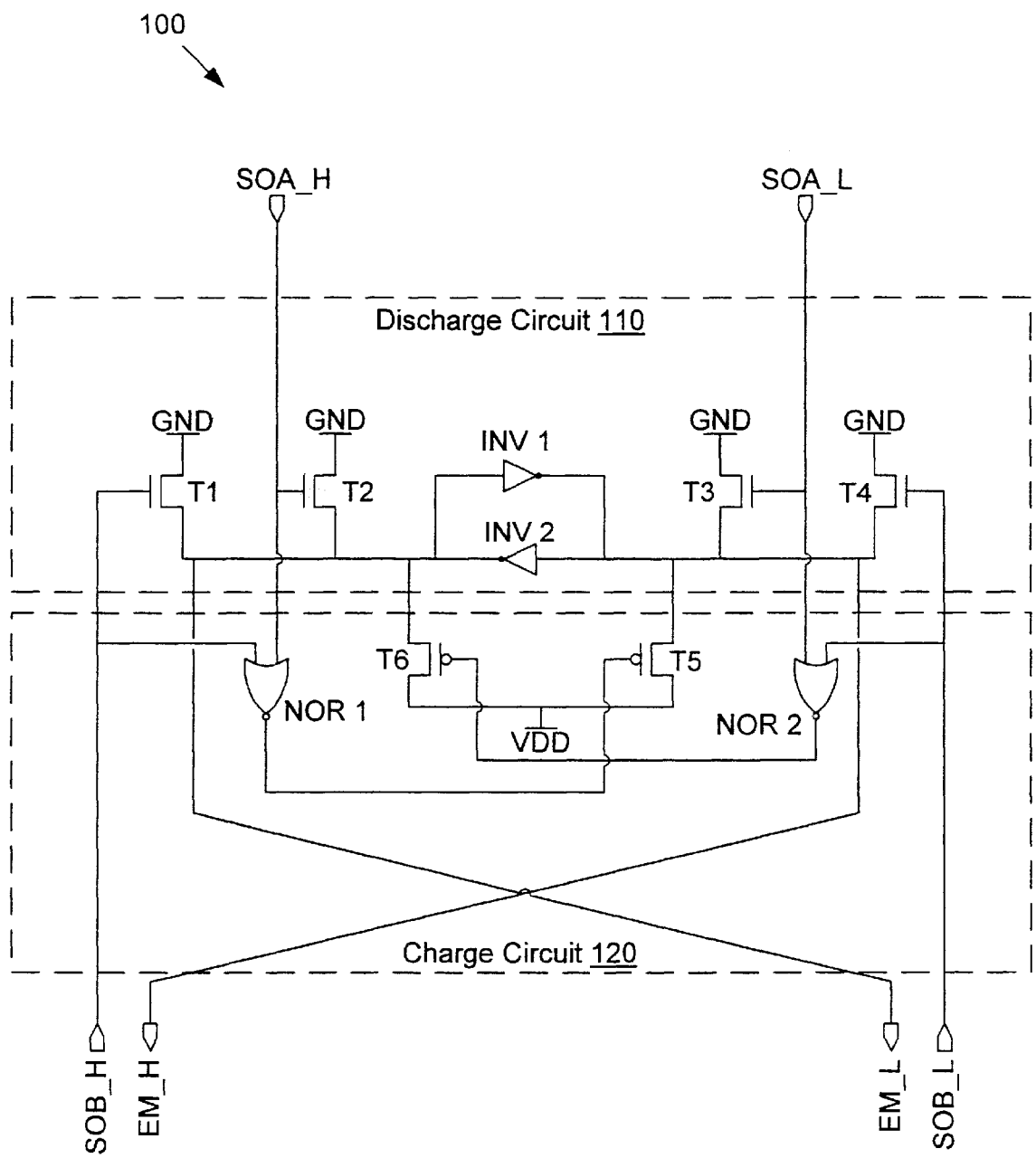
FIG. 2 is a circuit diagram of one embodiment of a multiplexer latch.

Referring to FIG. 2, a circuit diagram of one embodiment of a multiplexer latch 100 is shown. Multiplexer latch 100 includes six metal oxide semiconductor (MOS) transistors, four of which are N-channel and two are P-channel. The N-channel transistors are designated T1, T2, T3 and T4, while the P-channel transistors are designated T5 and T6. Multiplexer latch 100 also includes two NOR gates: NOR 1 and NOR 2; and two inverters: INV 1 and INV 2. Multiplexer latch 100 has two pairs of differential inputs and one differential output pair. The first pair of inputs is designated SOA_H and SOA_L and the second pair of inputs is designated SOB_H and SOB_L. The output pair is designated EM_H and EM_L.

Multiplexer latch 100 may be thought of as having two subcircuits: a discharge circuit 110 and a charge circuit 120. Operation of discharge circuit 110 is now described, while charge circuit 120 will be described in more detail below. The differential input signals are each connected to the gate terminal of one of the N-channel transistors. For example, SOB_H is connected to the gate of transistor T1, SOA_H is connected to the gate of transistor T2, SOA_L is connected to the gate of transistor T3, and SOB_L is connected to the gate of transistor T4. One terminal of each N-channel transistor is connected to ground, which is designated GND. The third terminals of transistors T1 and T2 are connected together and this connection is an output node EM_L. The third terminals of transistors T3 and T4 are connected together and this connection is an output node EM_H. The input of INV 1 and the output of INV 2 are connected to output node EM_L. The output of INV 1 and the input of INV 2 are connected to output node EM_H.

As noted above, either Bank A or Bank B of FIG. 1 will be active and therefore, only one pair of differential inputs to multiplexer latch circuit 100 may be active at a given time. When an input is not active in this embodiment, it is pre-charged to a low voltage (e.g. GND) by sense amp 40. It is noted that, in this embodiment, an active signal is a high voltage (e.g. VDD), and conversely, an inactive signal refers to a low voltage (e.g. GND). It is noted that in other embodiments, an active signal may be a low voltage (e.g. GND), while an inactive signal may be a high voltage (e.g. VDD).

In the following example, Bank A of FIG. 1 is active and bit cell 31 is storing a binary one. Therefore SOA_H of FIG. 2 is active and SOA_L is inactive, and both of SOB_H and SOB_L are inactive. Since SOA_H is active, a high voltage (e.g. VDD) is present on the gate of transistor T2, which causes transistor T2 to conduct or turn "on". When transistor T2 turns on, it provides a discharge path to GND for output node EM_L. In the illustrated embodiment, charge circuit 120 is used to charge output node EM_H when SOA_H or SOB_H is active, as described in more detail below. However, it is contemplated that some embodiments may use only discharge circuit 110. In such embodiments, as output node EM_L begins to discharge, INV 1 begins charging output node EM_H. In response to the charging of output node EM_H, INV 2 may now begin discharging output node EM_L in addition to the discharge path provided by transistor T2. This charging and discharging operation may continue until output node EM_L has a low voltage (e.g. GND) and output node EM_H has a high voltage (e.g. VDD). At this point, the cross-coupled inverters INV 1 and INV 2 have effectively "latched" the input signal present on SOA_H. Thus, if the SOA_H signal becomes inactive and transistor T2 turns off, multiplexer latch 100 retains the value on output nodes EM_H and EM_L until another input becomes active. The circuit operation is essentially the same if input SOB_H were to become active, except that transistor T1 would turn on instead of transistor T2.

Next, circuit operation is described for input SOA_L being active (e.g. bit cell 31 is storing a binary zero and Bank A being selected). Transistor T3 turns on providing a discharge path to GND for output node EM_H. As mentioned above, in the illustrated embodiment charge circuit 120 is used to charge output node EM_L when either SOA_L or SOB_L is active. However, embodiments are contemplated in which only discharge circuit 110 is used. In such embodiments, as output node EM_H begins to discharge, INV 2 begins charging output node EM_L. In response to the charging of output node EM_L, INV 1 may now begin discharging output node EM_H in addition to the discharge path provided by transistor T3. This charging and discharging operation may continue until output node EM_H has a low voltage (e.g. GND) and output node EM_L has a high voltage (e.g. VDD). Therefore, the cross-coupled inverters INV 1 and INV 2 have effectively "latched" the input signal present on SOA_L. Thus, if the SOA_L signal becomes inactive and transistor T3 turns off, multiplexer latch 100 retains the value on output nodes EM_H and EM_L until another input becomes active. Similarly, if input SOB_L were to become active, the operation of the circuit is essentially the same as above, except that transistor T4 would turn on instead of transistor T3.

As described above, multiplexer latch 100 selects the active input without the need for dedicated input select circuitry. The operation of charge circuit 120 will now be described. Charge circuit 120 includes NOR 1, NOR 2, T5 and T6. Input SOA_H is connected to one input of NOR 1, while input SOB_H is connected to the other input of NOR 1. Input SOA_L is connected to one input of NOR 2, while SOB_L is connected to the other input of NOR 2. The output of NOR 1 is connected to the gate terminal of transistor T5, while the output of NOR 2 is connected to the gate terminal of transistor T6. One terminal of each of transistor T5 and T6 are connected to a positive voltage supply, VDD. The third terminal of transistor T5 is connected to output node EM_H and the third terminal of transistor T6 is connected to output node EM_L.

As described above, discharge circuit 110 discharges one of nodes EM_H and EM_L in response to the activation of one of SOA_H, SOB_H, SOA_L, and SOB_L. In the absence of charge circuit 120, the transistors forming the inverter circuits INV1 and INV2 would also be responsible for charging the output node which is not being discharged, in order to complete the transition of the output nodes EM_H and EM_L to the new differential value. Thus, the transistors forming the inverter circuits INV 1 and INV 2, or at least the P-channel transistors, would be relatively large to provide a rapid charging of the node (e.g. comparable to the size of transistors T1–T4 but small enough to be overdriven by one of the transistors T1–T4). However, if the transistors forming the inverter circuits are comparable to the size of transistors T1–T4, then the P-channel transistor of the inverter circuit holding the VDD voltage on the node being discharged by transistors T1–T4 would compete with the discharging action. Since the P-channel transistor is providing charge which is then discharged by one of the transistors T1–T4, significant power loss may occur. Additionally, the transition of the output nodes may be slowed.

Charge circuit 120 is provided to charge the node which is not being discharged via transistors T1–T4. For example, if EM_H is being discharged by discharge circuit 110, charge circuit 120 may charge EM_L. Similarly, if EM_L is being discharged, charge circuit 120 may charge EM_H. Thus, the combination of transistors T1–T4 and charge circuit 120 may be used to switch the outputs EM_H and EM_L in response to the inputs SOA_H, SOB_H, SOA_L and SOB_L. Therefore, inverter circuits INV 1 and INV 2 may only be responsible for the latching function of multiplexer latch 100, and thus may be made small as compared to the transistors T1–T4 and the transistors in charge circuit 120. When the EM_H and EM_L nodes are being switched from a current voltage (VDD or ground) to the opposite voltage, the resistance by inverter circuits INV 1 and INV 2 to the change may be small and thus the power loss may be negligible. Thus, the combination of charge circuit 110 and discharge circuit 120 may provide a low power multiplexer latch circuit 100. Furthermore, since discharge circuit 110 actively discharges one of nodes EM_H and EM_L in response to the input signals and charge circuit 120 actively charges the other one of nodes EM_H and EM_L, the transition from one differential output to the other may be rapid.

In one example, Bank A of FIG. 1 is active and bit cell 31 is storing a binary one. Thus, SOA_H is active and SOA_L, SOB_H, and SOB_L are inactive. Since SOA_H is active, a high voltage (e.g. VDD) is present on the gate of transistor T2, which as described above, causes a output node EM_L to begin to discharge to GND. The high voltage (e.g. VDD) present on SOA_H is also present on one input of NOR 1 causing NOR 1 to output a binary zero (e.g. ground). This binary zero is applied to the gate of transistor T5, causing it to turn on, thus charging output node EM_H to VDD. Operation of charge circuit 120 is similar if SOB_H becomes active.

To illustrate the operation of charge circuit 120 further, an example is described in which SOA_L becomes active and output EM_H is initially latched to a high voltage (e.g. VDD) and EM_L is initially latched to a low voltage (e.g. GND) from a previous input. When input SOA_L becomes active, transistor T3 turns on allowing output node EM_H to begin to discharge through it. When SOA_L becomes active, the high voltage (e.g. VDD) present on the gate of transistor T3 is also present on one input of NOR 2. This causes the NOR 2 output to be a binary zero. This binary zero is then presented to the gate terminal of transistor T6 causing it to turn on, thus charging output node EM_L to VDD.

Thus charge circuit 120 may increase the speed at which the output nodes of multiplexer latch 100 are able to switch to new values. Furthermore, the multiplexer latch circuit 100 may be low in power consumption due to low drive competition during switching from the latching circuit.

Transistors T1–T6 may be large compared to the transistors forming INV 1 and INV 2. In one embodiment, the effective ratio of each of T1–T6 to the transistors forming INV 1 and INV 2 may be on the order of 10–15. However, any suitable size ratio may be used.

It is noted that in this embodiment, the wires that connect to output nodes EM_H and EM_L may be criss-crossed such that the EM_H output wire is physically located near input SOB_H and the EM_L output wire is physically located near input SOB_L during circuit layout. The output wires may be laid out this way to improve immunity to cross-coupling of signals due to the long length of the input wires from Bank B. For example, the wire connected to EM_H is placed near input wire SOB_H because if output EM_H is latched to a low voltage (e.g. GND), and SOB_H becomes active, a high voltage (e.g. VDD) will result on EM_H. In other words, switching SOB_H to a high voltage leads to EM_H switching to a high voltage. Since the two wires carrying SOB_H and EM_H may physically be near each other, the cross-coupling of the signals may not hinder the switching of SOB_H (as may be the case if EM_L were to be physically near SOB_H for a long distance). If the wires were positioned such that SOB_H is located near EM_L, then if SOB_H becomes active, EM_L may switch to GND. The discharging to GND of EM_L may cause the voltage on SOB_H to dip as a result of cross-coupling of the signals. Thus, laying out the wires as shown in FIG. 2 may reduce cross-coupling noise. It is contemplated however, that other embodiments may not layout the wires this way.

Although multiplexer latch 100 is shown with two pairs of differential inputs in FIG. 2, it is contemplated that multiplexer latch 100 may have any number of pairs of differential inputs. For each additional differential input, FIG. 2 would be modified by adding an additional N-channel transistor for each high voltage input in parallel with T1 and T2, an additional N-channel transistor for each low voltage input in parallel with T3 and T4, and an additional input on each of NOR 1 and NOR 2. More specifically, to add a single differential input SOC_H and SOC_L, an N-channel transistor T7 may be added and connected similar to transistors T1 and T2 with the gate of T7 connected to SOC_H. Additionally, another N-channel transistor T8 may be added and connected similar to transistors T3 and T4 with the gate of T8 connected to SOC_L. NOR 1 and NOR 2 would be expended to 3-input NOR gates with input SOC_H and SOC_L connected to the third input of each NOR gate, respectively. Thus multiplexer latch 100 may be expended to any number of inputs.

It is noted that, while the embodiment of FIG. 1 illustrates the use of multiplexer latch circuit 100 with a cache, multiplexer latch 100 may be used to multiplex and latch any set of differential signals.

As used herein, a circuit or transistor "drives" a node or signal line if that circuit or transistor attempts to either charge or discharge the node or signal line.

Figure 3:
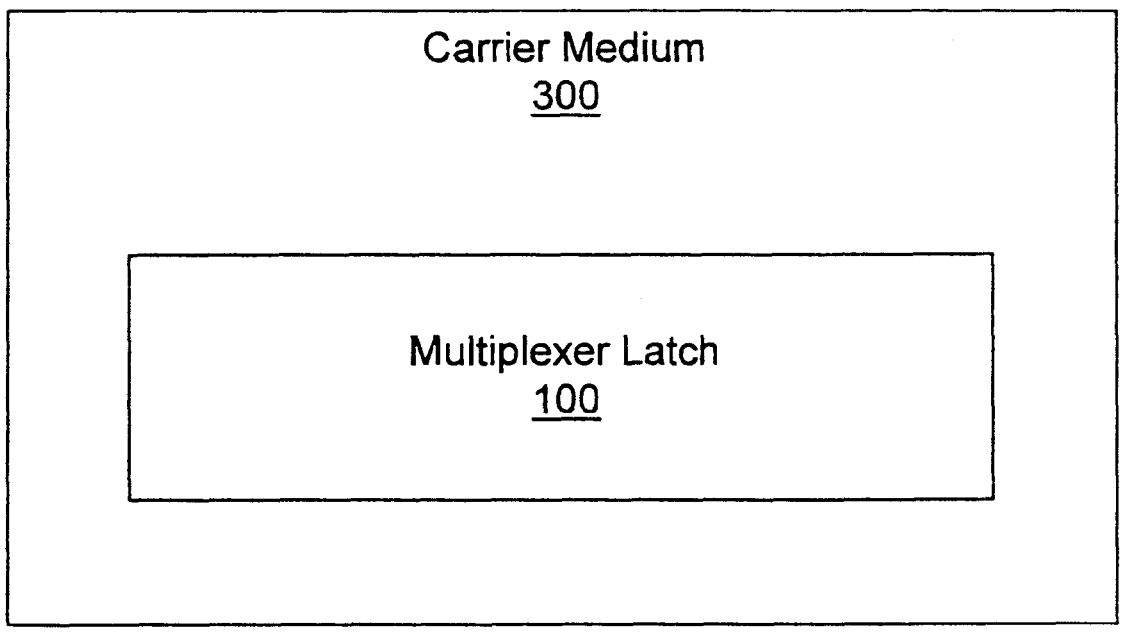
FIG. 3 is a block diagram of one embodiment of a carrier medium.

Turning next to FIG. 3, a block diagram of a carrier medium 300 including a database representative of multiplexer latch circuit 100 is shown. Generally speaking, a carrier medium may include storage media such as magnetic or optical media, e.g., disk or CD-ROM, volatile or non-volatile memory media such as RAM (e.g. SDRAM, RDRAM, SRAM, etc.), ROM, etc., as well as transmission media or signals such as electrical, electromagnetic, or digital signals, conveyed via a communication medium such as a network and/or a wireless link.

Generally, the database of multiplexer latch circuit 100 carried on carrier medium 300 may be a database which can be read by a program and used, directly or indirectly, to fabricate the hardware comprising the circuit 100. For example, the database may be a circuit description file which may be read by a circuit simulator (e.g. Spice) for simulating the circuit, or may be a netlist or other file including a list of the transistors and interconnect therebetween. The netlist or other file may then be processed to produce a data set describing geometric shapes to be applied to masks. The masks may then be used in various semiconductor fabrication steps to produce a semiconductor circuit or circuits corresponding to multiplexer latch circuit 100. Alternatively, the database on carrier medium 300 may be the data set, as desired.

While carrier medium 300 carries a representation of multiplexer latch circuit 100 other embodiments may carry a representation of the circuitry of FIG. 1, or any portion of the circuitry of FIG. 1 or FIG. 2, as desired.

Numerous variations and modifications will become apparent to those skilled in the art once the above disclosure is fully appreciated. It is intended that the following claims be interpreted to embrace all such variations and modifications.

What is claimed is:

1. A multiplexer circuit comprising:
   a first subcircuit coupled to receive at least a first signal and a second signal, wherein said first subcircuit is configured to drive a first output node responsive to either of said first signal or said second signal being active;
   a second subcircuit coupled to receive at least a third signal and a fourth signal and configured to drive a second output node responsive to either of said third signal or said fourth signal being active;
   a latching circuit coupled to said first output node and said second output node, wherein said latching circuit is configured to capture and retain a first output on said first output node and a second output on said second output node; and a third subcircuit coupled to receive said first, second, third and fourth signals and coupled to said first and second output nodes, wherein said third subcircuit is configured to drive said second output node responsive to either one of said first signal or said second signal being active, wherein said third subcircuit is configured to drive said first output node responsive to either one of said third signal or said fourth signal being active.

2. The multiplexer circuit as recited in claim 1, wherein said third subcircuit is further configured to drive said first output node by charging said first output node and wherein said third subcircuit is configured to drive said second output node by charging said second output node.

3. The multiplexer circuit as recited in claim 2, wherein said first subcircuit is further configured to drive said first output node by discharging said first output node and said second subcircuit is further configured to drive said second output node by discharging said second output node.

4. The multiplexer circuit as recited in claim 2, wherein said first output on said first output node is a binary zero responsive to said third signal or said fourth signal being active, wherein said second output on said second output node is a binary one responsive to said third signal or said fourth signal being active.

5. The multiplexer circuit as recited in claim 2, wherein said first output on said first output node is a binary one responsive to said first signal or said second signal being active, wherein said second output on said second output node is a binary zero responsive to said first signal or said second signal being active.

6. The multiplexer circuit as recited in claim 2, wherein said first signal, said second signal, said third signal and said fourth signal are precharged to an inactive state in which said first signal, said second signal, said third signal and said fourth signal are a binary zero.

7. A memory subsystem comprising:
a cache memory system including:
a memory having a first bank configured to output a first differential signal pair including a first signal and a third signal and a second bank configured to output a second differential signal pair including a second signal and a fourth signal; and
a multiplexer coupled between said memory and a differential output including a first output node and a second output node, wherein said multiplexer includes:
a first subcircuit coupled to receive at least said first signal and said second signal, wherein said first subcircuit is configured to drive said first output node responsive to either of said first signal or said second signal being active;
a second subcircuit coupled to receive at least said third signal and said fourth signal and configured to drive said second output node responsive to either of said third signal or said fourth signal being active;
a latching circuit coupled to said first output node and said second output node, wherein said latching circuit is configured to capture and retain a first output on said first output node and a second output on said second output node; and
a third subcircuit coupled to receive said first, second, third and fourth signals and coupled to said first and second output nodes, wherein said third subcircuit is configured to drive said second output node responsive to either one of said first signal or said second signal being active, wherein said third subcircuit is configured to drive said first output node responsive to either one of said third signal or said fourth signal being active.

8. The memory subsystem as recited in claim 7, wherein said third subcircuit is further configured to drive said first output node by charging said first output node and wherein said third subcircuit is configured to drive said second output node by charging said second output node.

9. The memory subsystem as recited in claim 8, wherein said first subcircuit is further configured to drive said first output node by discharging said first output node and said second subcircuit is further configured to drive said second output node by discharging said second output node.

10. The memory subsystem as recited in claim 8, wherein said first output on said first output node is a binary zero responsive to said third signal or said fourth signal being active, wherein said second output on said second output node is a binary one responsive to said third signal or said fourth signal being active.

11. The memory subsystem as recited in claim 8, wherein said first output on said first output node is a binary one responsive to said first signal or said second signal being active, wherein said second output on said second output node is a binary zero responsive to said first signal or said second signal being active.

12. The memory subsystem as recited in claim 8, wherein said first differential signal pair and said second differential signal pair are precharged to an inactive state in which said first signal, said second signal, said third signal and said fourth signal are a binary zero.

13. A method comprising:
receiving a first pair of differential input signals including a first input signal and a second input signal and a second pair of differential input signals including a third input signal and a fourth input signal;
driving a first node of a pair of differential output nodes to a first output state responsive to either said first input signal being active or said third input signal being active;
driving a second node of said pair of differential output nodes to said first output state responsive to either said second input signal or to said fourth input signal being active;
retaining a differential output on said first output node and said second output node of said pair of differential output nodes using a latching circuit responsive to said first input signal, said second input signal, said third input signal and said fourth input signal becoming inactive; and
independent of said latching circuit, driving said second node to a second output state responsive to either said first input signal being active or said third input signal being active and driving said first node to said second output state responsive to either said second input signal or to said fourth input signal being active.

14. The method as recited in claim 13, wherein said first output state is a binary zero and said second output state is a binary one.

15. The method as recited in claim 13, wherein said first output state is a binary one and said second output state is a binary zero.

16. The method as recited in claim 13, wherein said retaining a differential output on said first output node and said second output node of said pair of differential output nodes includes latching said first output state and said second output state across a pair of cross-coupled inverters.

17. The method as recited in claim 13, wherein said first differential signal pair and said second differential signal pair are precharged to an inactive state in which said first input signal, said second input signal, said third input signal and said fourth input signal are a binary zero.

18. A carrier medium comprising a database representing:
- a first subcircuit coupled to receive at least a first signal and a second signal, wherein said first subcircuit is configured to drive a first output node responsive to either of said first signal or said second signal being active;
- a second subcircuit coupled to receive at least a third signal and a fourth signal and configured to drive a second output node responsive to either of said third signal or said fourth signal being active;
- a latching circuit coupled to said first output node and said second output node, wherein said latching circuit is configured to capture and retain a first output on said first output node and a second output on said second output node; and
- a third subcircuit coupled to receive said first, second, third and fourth signals and coupled to said first and second output nodes, wherein said third subcircuit is configured to drive said second output node responsive to either one of said first signal or said second signal being active, wherein said third subcircuit is configured to drive said first output node responsive to either one of said third signal or said fourth signal being active.

19. The carrier medium as recited in claim 18, wherein said third subcircuit is further configured to drive said first output node by charging said first output node and wherein said third subcircuit is configured to drive said second output node by charging said second output node.

20. The carrier medium as recited in claim 19, wherein said first subcircuit is further configured to drive said first output node by discharging said first output node and said second subcircuit is further configured to drive said second output node by discharging said second output node.

21. The carrier medium as recited in claim 19, wherein said first output on said first output node is a binary zero responsive to said third signal or said fourth signal being active, wherein said second output on said second output node is a binary one responsive to said third signal or said fourth signal being active.

22. The carrier medium as recited in claim 19, wherein said first output on said first output node is a binary one responsive to said first signal or said second signal being active, wherein said second output on said second output node is a binary zero responsive to said first signal or said second signal being active.

23. The carrier medium as recited in claim 19, wherein said first signal, said second signal, said third signal and said fourth signal are precharged to an inactive state in which said first signal, said second signal, said third signal and said fourth signal are a binary zero.

* * * * *